United States Patent
Kim et al.

(10) Patent No.: US 7,791,142 B2
(45) Date of Patent: Sep. 7, 2010

(54) ELECTROSTATIC DISCHARGE PROTECTION DIODE

(75) Inventors: Dae-shik Kim, Suwon-si (KR); Kyoung-mok Son, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 12/291,087

(22) Filed: Nov. 6, 2008

(65) Prior Publication Data

US 2009/0273869 A1    Nov. 5, 2009

(30) Foreign Application Priority Data

Apr. 30, 2008    (KR) .................. 10-2008-0040825

(51) Int. Cl.
    *H01L 23/62* (2006.01)
(52) U.S. Cl. ....................................... 257/355; 361/56
(58) Field of Classification Search ................. 257/355; 361/56
    See application file for complete search history.

(56) References Cited

U.S. PATENT DOCUMENTS

| | | | | |
|---|---|---|---|---|
| 5,597,758 A * | 1/1997 | Heim et al. | ................. | 438/527 |
| 6,987,300 B2 * | 1/2006 | Yach et al. | ................. | 257/361 |
| 2007/0215948 A1 | 9/2007 | Yang | | |

FOREIGN PATENT DOCUMENTS

| KR | 2000-0045432 | 7/2000 |
|---|---|---|
| KR | 10-0631958 | 9/2006 |
| KR | 10-2007-0094293 | 9/2007 |

* cited by examiner

*Primary Examiner*—Zandra Smith
*Assistant Examiner*—Paul E Patton
(74) *Attorney, Agent, or Firm*—Mills & Onello, LLP

(57) ABSTRACT

Provided is an electrostatic discharge (ESD) protection diode including: a well formed of a first conductivity in a semiconductor substrate; an active region that is formed of a second conductivity in the well and includes a plurality of first active lines extending in a first direction; a sub-region of the first conductivity including a plurality of first sub-lines extending in the first direction, the first sub lines being formed in the well, arranged to surround an outer region of the first active lines, and arranged in alternation with the first active lines; a device isolation region separating the active regions and the sub-regions; a plurality of active contacts arranged in a row in the active regions; and a plurality of sub-contacts arranged in a row in the sub-region.

13 Claims, 6 Drawing Sheets

ELECTROSTATIC DISCHARGE PROTECTION DIODE

CROSS-REFERENCE TO RELATED PATENT APPLICATION

This application claims the benefit of Korean Patent Application No. 10-2008-0040825, filed on Apr. 30, 2008 in the Korean Intellectual Property Office, the disclosure of which is incorporated herein in its entirety by reference.

BACKGROUND OF THE INVENTION

1. Field of the Invention

The present invention relates to a semiconductor device including an electrostatic discharge (ESD) protection diode for protecting circuits on the semiconductor device from ESD.

2. Description of the Related Art

Electrostatic discharge (ESD) usually occurs when a semiconductor device comes into contact with or is positioned near an object charged to a considerably different electrostatic potential than that of the semiconductor device. During ESD, a large amount of charges are usually transferred to the semiconductor device for a time shorter than 1 μs, and a temporary voltage or current is generated in the semiconductor device due to this voltage or current. Such a temporary voltage or current that exceeds the operational range of the semiconductor device can damage circuits in the semiconductor device. Consequently, in order to protect the semiconductor device from destruction due to inflow of these kinds of temporary voltages or currents, an ESD protection circuit is inserted into a portion which externally connects the semiconductor device, for example, an input pad. ESD is diverted by the ESD protection circuit through a ground line or a power supply line, and, thus, the circuits inside the semiconductor device are protected.

When a diode is used as an ESD protection device, a well of the semiconductor substrate functions as a first electrode of the diode, and an active region that is formed in the well and has an opposite conductivity to the well, functions as a second electrode. A contact that is connected to an input pad, a ground line, or a power supply line is connected to the well and the active region. In a portion where the contact is connected to the well, a heavy impurity region is formed in order to form an Ohmic contact. The high impurity region of the well is called a sub-region, and corresponds to the active region.

FIG. 1 illustrates a layout of a conventional ESD protection diode. Referring to FIG. 1, an active region 10, which is tetragonal or polygonal, is surrounded by a sub-region 20, which is a high impurity region of a well. A device isolation layer 30 is formed between the active region 10 and the sub-region 20. Contacts 12 and 22 are respectively formed in the active region 10 and the sub-region 20.

When a current flows through the ESD protection diode, the arrangement of the contacts 12 and 22 influences the flow of the current. Contacts 12a at corners of the tetragonal active region 10 are surrounded by the contacts 22 of the sub-region 20 which are more in number than contacts 12b and 12c at non-corner portions of the active region 10. Since many paths through which current flows are provided around the contacts 12a, a resistance seen at the path of a current through the contacts 12a is small, and thus the current concentrates on the contacts 12a, and accordingly, the contacts 12a are likely to be damaged.

On the other hand, as a current concentrates on the contacts 12a, the current may not substantially flow through the contacts 12b and 12c on the non-corner portions of the active region 10. In particular, less current may flow through the contacts 12c in inner portions of the active region 10, surrounded by other contacts, than through the contacts 12b on edges of the active 10. Accordingly, ESD current may not be efficiently emitted despite the surface area that the active region 10 occupies.

SUMMARY OF THE INVENTION

The present invention provides an electrostatic discharge (ESD) protection diode that is less susceptible to damage, wherein an area of the ESD protection diode can be reduced and the diverted flow of ESD current can be improved.

According to an aspect of the present invention, there is provided an electrostatic discharge (ESD) protection diode comprising: a well formed in a semiconductor substrate of a first conductivity type; an active region formed of a second conductivity type in the well and including a plurality of first active lines extending in a first direction; a sub-region formed of the first conductivity type including a plurality of first sub-lines extending in the first direction, the first sub-lines being formed in the well, arranged to surround an outer region of the first active lines, and in an alternating arrangement with the first active lines; a device isolation region separating the active regions and the sub-regions; a plurality of active contacts arranged in a row in the active regions; and a plurality of sub-contacts arranged in a row in the sub-region.

The ESD protection diode may further comprise second active lines extending in a second direction and connecting the first active lines.

The ESD protection diode may further comprise second active lines extending in a second direction and connecting the first active lines.

The second active lines may be void of active contacts.

The ESD protection diode may further comprise second sub-lines extending in the second direction and connecting ends of the first direction sub-lines.

The second direction sub-lines may be void of sub-contacts.

End portions of each first active lines may be void of active contacts.

A distance between the first active lines and the second sub-lines may be greater than a distance between the first active lines and the first sub-lines.

A distance between the first active lines and the second sub-lines may be greater than a distance between the first active lines and the first direction sub-lines, and end portions of each of the first active lines may be void of active contacts.

The first conductivity may be a p-type, and the second conductivity may be an n-type.

The first conductivity may be an n-type, and the second conductivity may be a p-type.

The active region may be heavily doped.

The sub-region may be heavily doped.

The active contacts may be arranged at regular intervals.

The sub-contacts may be arranged at regular intervals.

The second direction can be substantially perpendicular to the first direction.

In accordance with another aspect of the invention, provided is a method of making an ESD protection diode, the method comprising: forming a well in a semiconductor substrate having a first conductivity type; forming an active region having a second conductivity type in the well, the active region including a plurality of first active lines extending in a first direction; forming a sub-region having the first conductivity type, including forming a plurality of first sub-lines in the well extending in the first direction, the first sub-lines being formed in the well, arranged to surround an outer region of the first active lines, and in an alternating arrangement with the first active lines; providing a device isolation region separating the active regions and the sub-regions; arranging a plurality of active contacts in a row in the active regions; and arranging a plurality of sub-contacts in a row in the sub-region.

The method can further comprise forming second active lines extending in a second direction and connecting the first active lines.

The method can further comprise forming the second active lines to be void of active contacts.

The method can further comprise forming second sub-lines extending in the second direction and connecting ends of the first direction sub-lines.

The method can further comprise forming the end portions of each first active lines to be void of active contacts.

BRIEF DESCRIPTION OF THE DRAWINGS

The above and other aspects of the present invention will become more apparent by describing in detail exemplary embodiments in accordance therewith, with reference to the attached drawings in which.

DETAILED DESCRIPTION OF EXEMPLARY EMBODIMENTS

Figure 1:
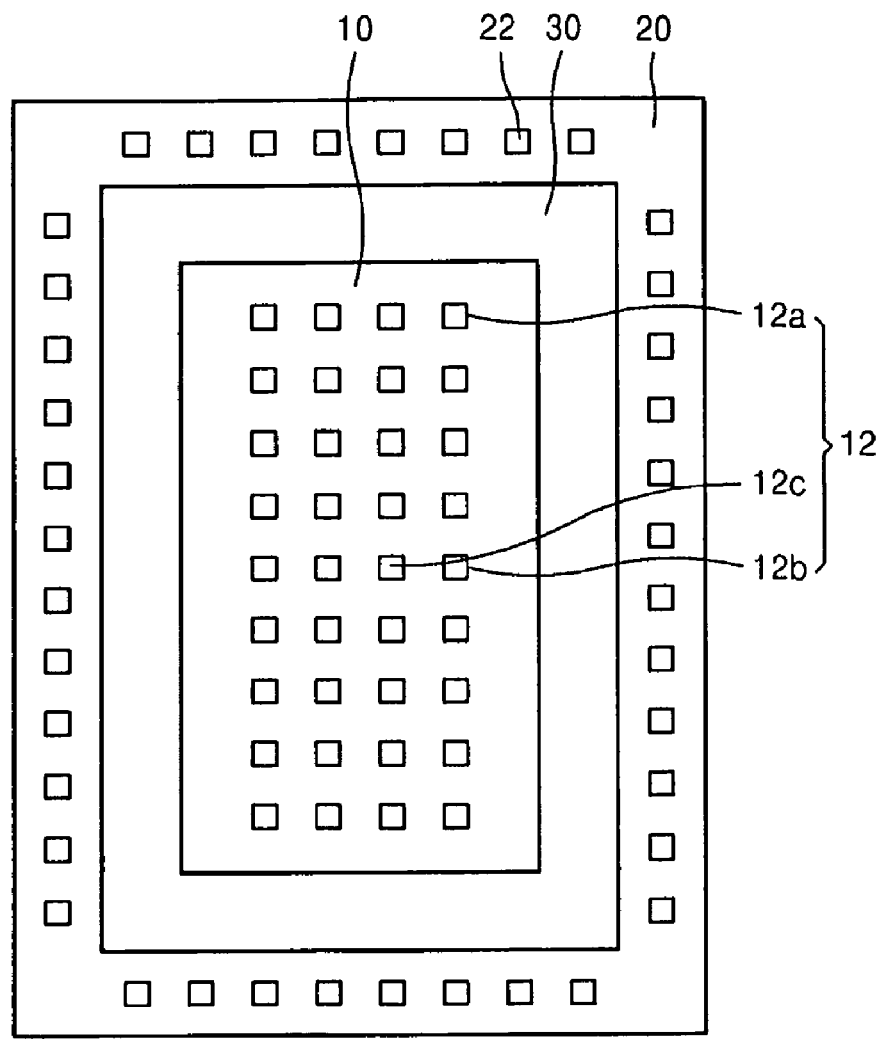
FIG. 1 illustrates a layout of a conventional electrostatic discharge (ESD) protection diode.

Embodiments in accordance with the present invention will now be described more fully with reference to the accompanying drawings. The invention may, however, be embodied in many different forms, and should not be construed as being limited to the embodiments set forth herein; rather. In the drawings, the thicknesses of layers and regions are exaggerated for clarity. Like reference numerals denote like elements throughout the specification.

Figure 2:
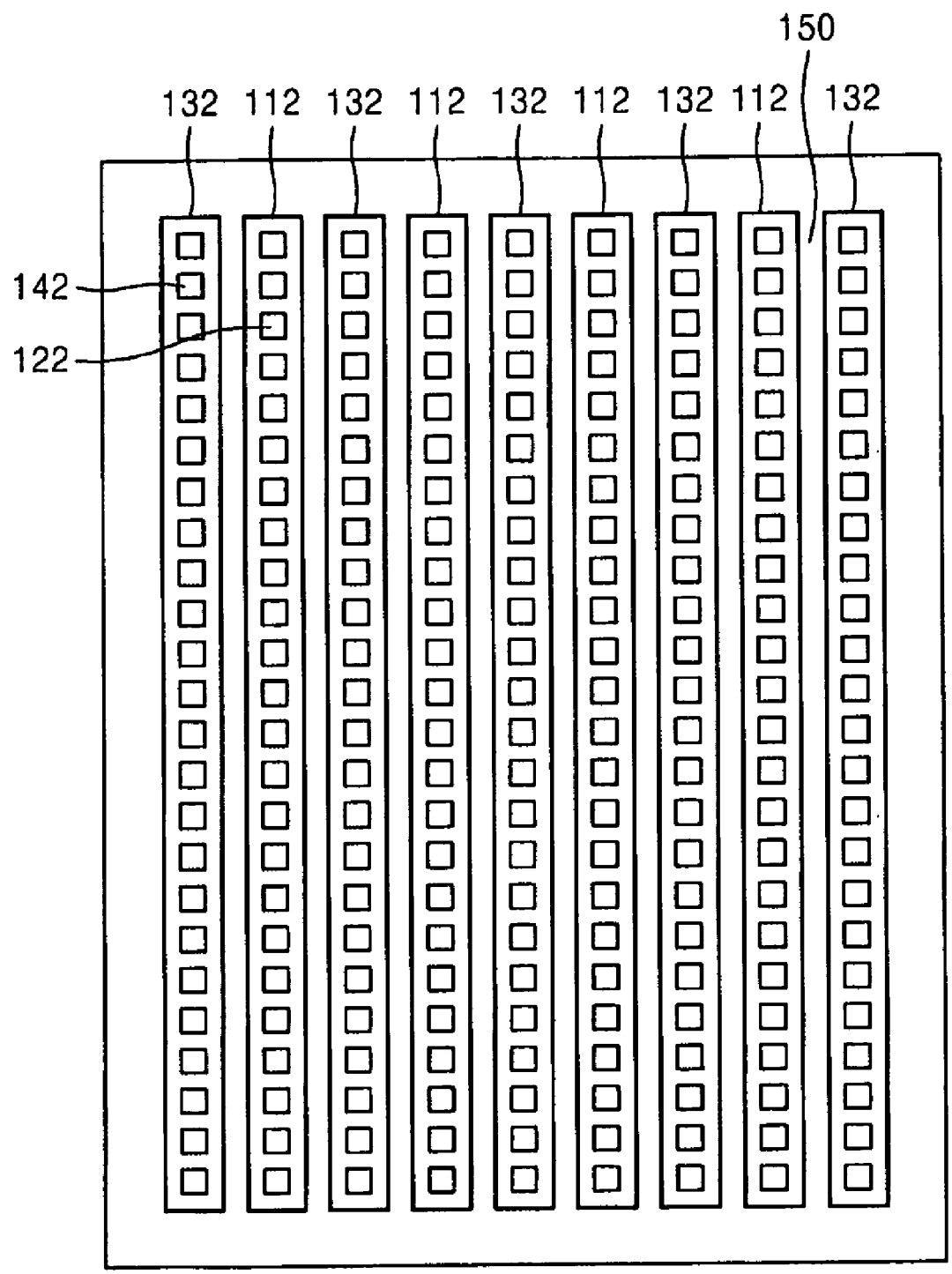
FIG. 2 illustrates an embodiment of a layout of an ESD protection diode according to an aspect of the present invention.

FIG. 2 illustrates a layout of an embodiment of an electrostatic discharge (ESD) protection diode according to an aspect of the present invention. Referring to FIG. 2, a p-type active region 112 and an n-type sub-region 132 are alternately arranged as parallel lines in an n-type well (not shown). The active region 112 and the sub-region 132 are separated from one another by a device isolation region 150. A plurality of active contacts 122 are arranged in a row at regular intervals in the active region 112, and a plurality of sub-contacts 142 are similarly arranged in the sub-region 132. The contacts 122 and sub-contacts 142 are connected to an input pad, a power supply line, or a ground line.

The n-type well (not shown) and the p-type active region 112 each form two electrodes of an ESD protection diode. Contacts connected to the n-type well fall to the n-type sub-region 132, and the n-type sub-region 132 is heavily doped to reduce contact resistance between the sub-region 132 and the contacts. In the same manner, the p-type active region 112 is heavily doped to reduce contact resistance between the active region 112 and the contacts.

In the current embodiment, the active region 112 and the sub-region 132 are arranged alternately in lines, and the active contacts 122 and the sub-contacts 142 are arranged in a row within the lines. Thus a resistance seen at each point of the active region 112 to the sub-region 132 is the same. That is, the relative arrangement of the active regions 112 and the sub-regions 132 and the relative arrangement of the active contacts 122 and the sub-contacts 142 thereon are symmetrical to each other, and thus the resistance seen from the active regions 112 is uniform. An end of the active region 112 is not surrounded by the sub-region 132, unlike the conventional ESD diode illustrated in FIG. 1, and thus the resistance at the end of the active region 112 is not smaller than the resistance at the inside of the active region 112. Accordingly, ESD current does not concentrate on the end of the active region 112. Accordingly, ESD current does not concentrate on a particular point inside the ESD protection diode in the embodiment illustrated in FIG. 2 but is distributed uniformly over the entire ESD protection diode. Accordingly, ESD current can be efficiently and safely diverted away. Also, since the ESD current does not concentrate on a particular point, the components at particular points of the ESD protection diode do not deteriorate, and the reliability of the ESD protection diode are accordingly improved.

Figure 3:
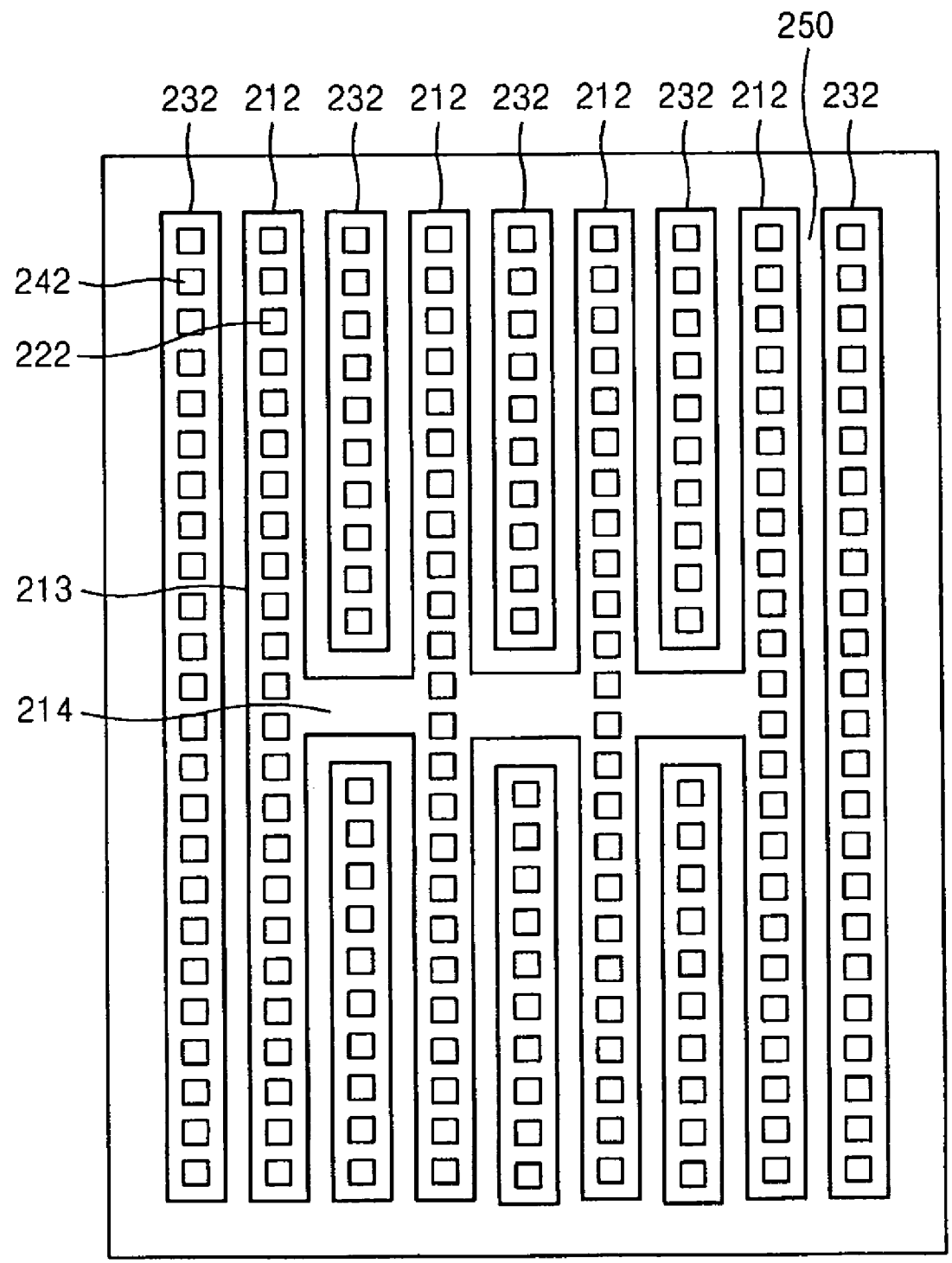
FIG. 3 illustrates a layout of an embodiment of an ESD protection diode according to another aspect of the present invention.

FIG. 3 is a layout of an embodiment of an ESD protection diode according to another aspect of the present invention. Active regions 212 illustrated in FIG. 3 include active lines 213 that extend in parallel in a first direction and an active connection portion 214 connecting middle portions of the active lines 213. The ESD protection diode of FIG. 3 is similar to the ESD protection diode of FIG. 2, except that the active lines 213 are connected to one another in the center by the presence of the active connection portion 214. As the active lines 213 are connected to one another by the active connection portion 214, current can be easily distributed, and also, ESD current can be easily distributed in the ESD protection diode. Meanwhile, active contacts 222 are not formed in the active connection portion 214. This is to prevent concentration of current on ends of the sub-regions 232 from the active regions 212 (including active lines 213 and active connection portion 214) surrounding the ends of the sub-regions 232 via the active contacts 222. Reference number 250 denotes a device isolation region.

Figure 4:
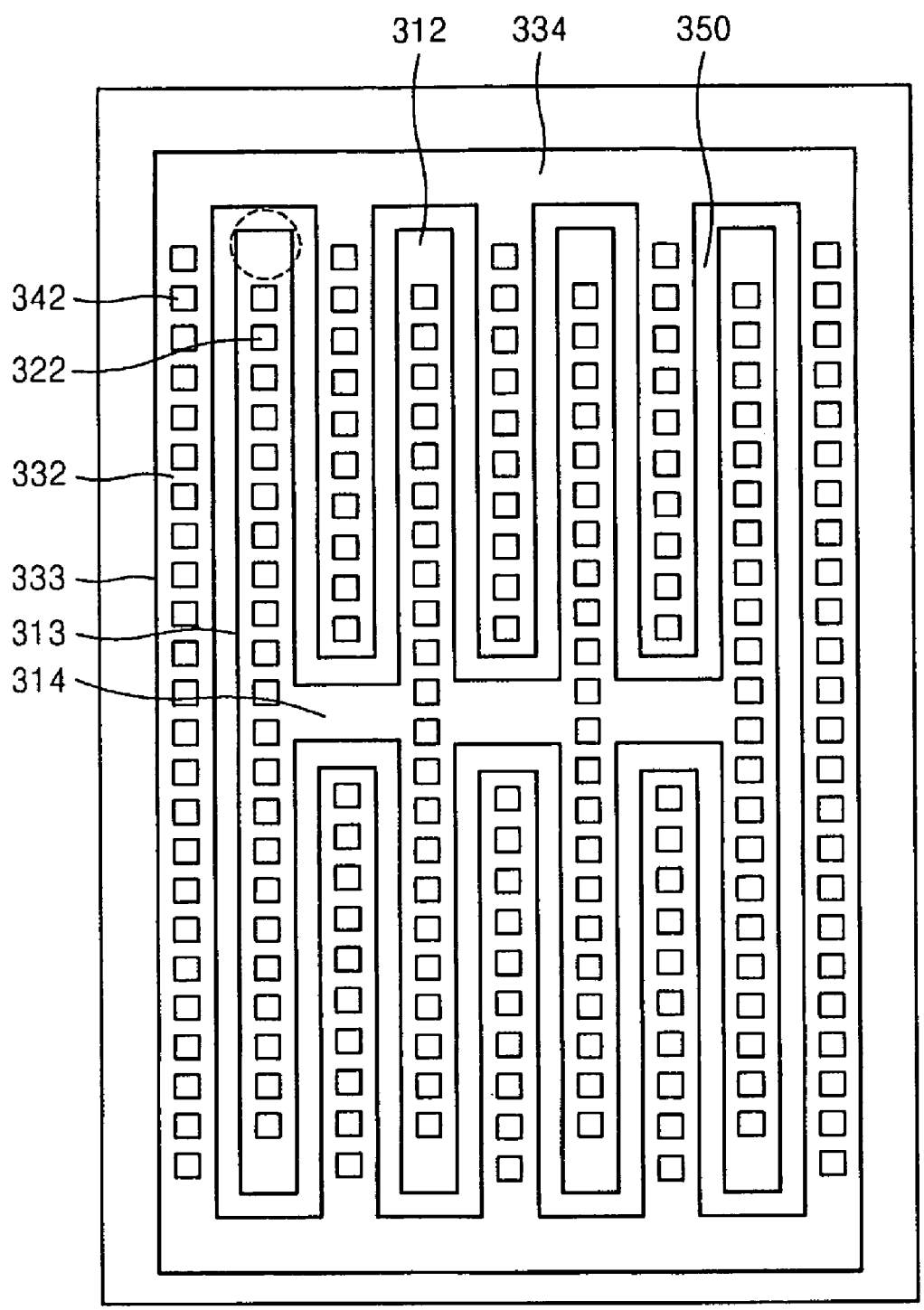
FIG. 4 illustrates a layout of an embodiment of an ESD protection diode according to another aspect of the present invention.

FIG. 4 is a layout of an embodiment of an ESD protection diode according to another aspect of the present invention. Active regions 312 of FIG. 4 also include active lines 313 and an active connection portion 314 connecting middle portions of the active lines 313. Also, sub-regions 332 of FIG. 4 include sub-lines 333 that are alternately arranged with the active lines 313 of the active regions and a sub-connecting portion 334 connecting ends of the sub-lines 333. The ESD protection diode of FIG. 4 is different from the ESD protection diode of FIG. 3 in that the ends of the sub-lines 332 are connected to one another other and that no active contact 322 is formed at ends (indicated by a dashed circle) of the active lines 313.

As the sub-regions 332 are connected to one another, current can be easily distributed in the sub-regions 332 (including sub-lines 333 and sub-connecting portion 334), and thus ESD current can easily be distributed in the ESD protection diode. Meanwhile, since no active contacts 322 are formed at the ends of the active lines 313 facing a sub-connection portion 334, concentration of current via active contacts 322 at the ends of the active lines 313 surrounded by the sub-regions can be prevented. Reference number 350 denotes a device isolation region.

Figure 5:
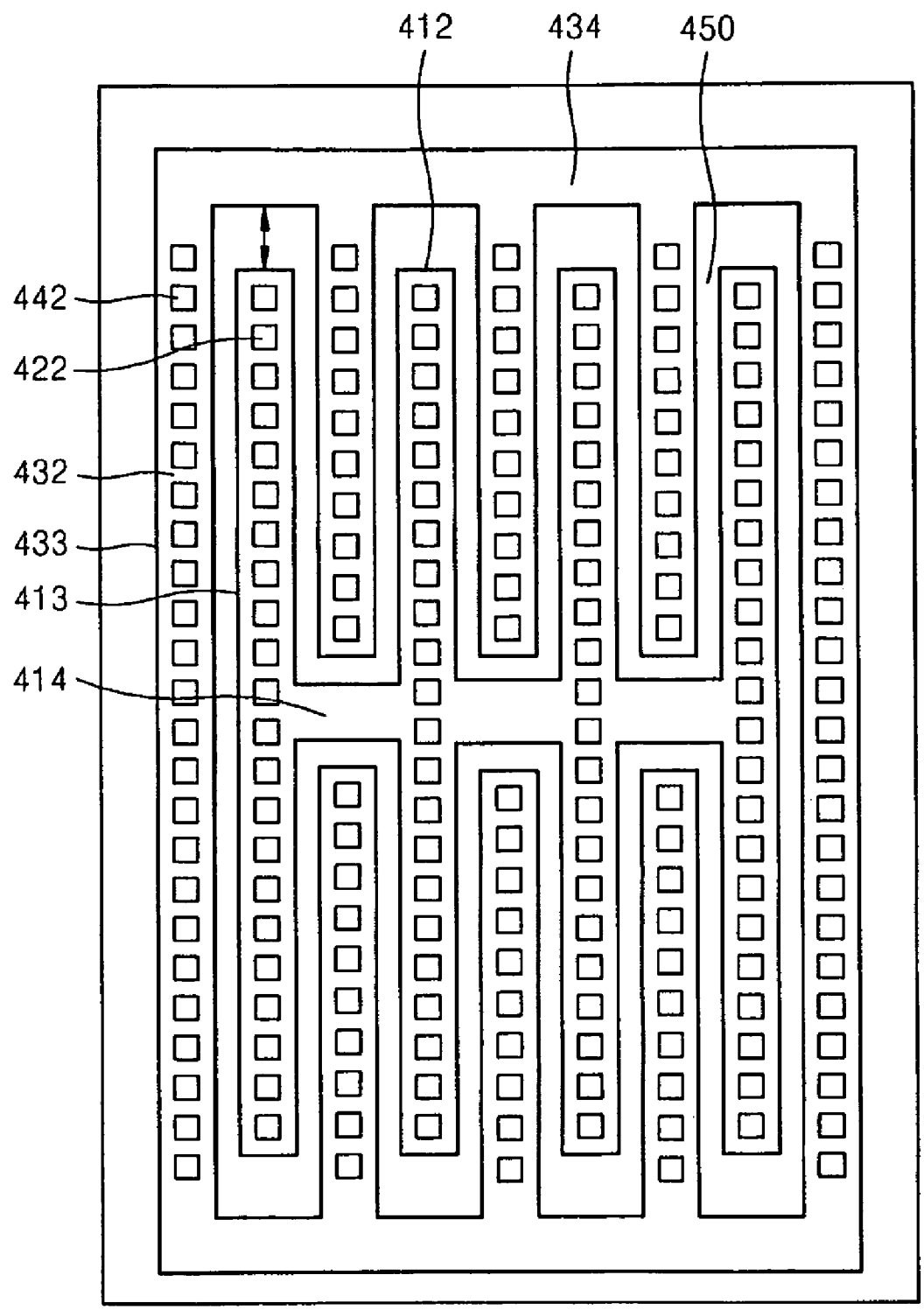
FIG. 5 illustrates a layout of an embodiment of an ESD protection diode according to another aspect of the present invention.

FIG. 5 illustrates a layout of an embodiment of an ESD protection diode according to another aspect of the present invention. Active regions 412 of FIG. 5 also include active lines 413 and an active connection portion 414 connecting middle portions of the active lines 413. Also, sub-regions 432 and 434 of FIG. 5 include sub-lines 433 that are alternately arranged with the active lines 413 of the active regions and sub-connecting portion 434 connecting ends of the sub lines 433. The ESD protection diode of FIG. 5 is different from the ESD protection diode of FIG. 4 in that a distance between the ends of the active lines 413 and subconnecting portion 434, that is, a distance illustrated by an arrow in FIG. 5, is greater in the device shown in FIG. 5. In the ESD protection diode of FIG. 5, a space is left between the active lines 413 and sub-connecting portion 434 in order to prevent concentration of ESD current on the ends of the active lines 413, which may be caused due to increased resistance seen from the end of the active lines 413. As the active lines 413 are shortened in comparison with the sub-lines 433, the sub-lines 433 relatively extend further past the ends of the active lines 413, and thus a resistance seen from the ends of the active lines 413 and a resistance seen from the middle portions of the active regions 413 may be similar.

Figure 6:
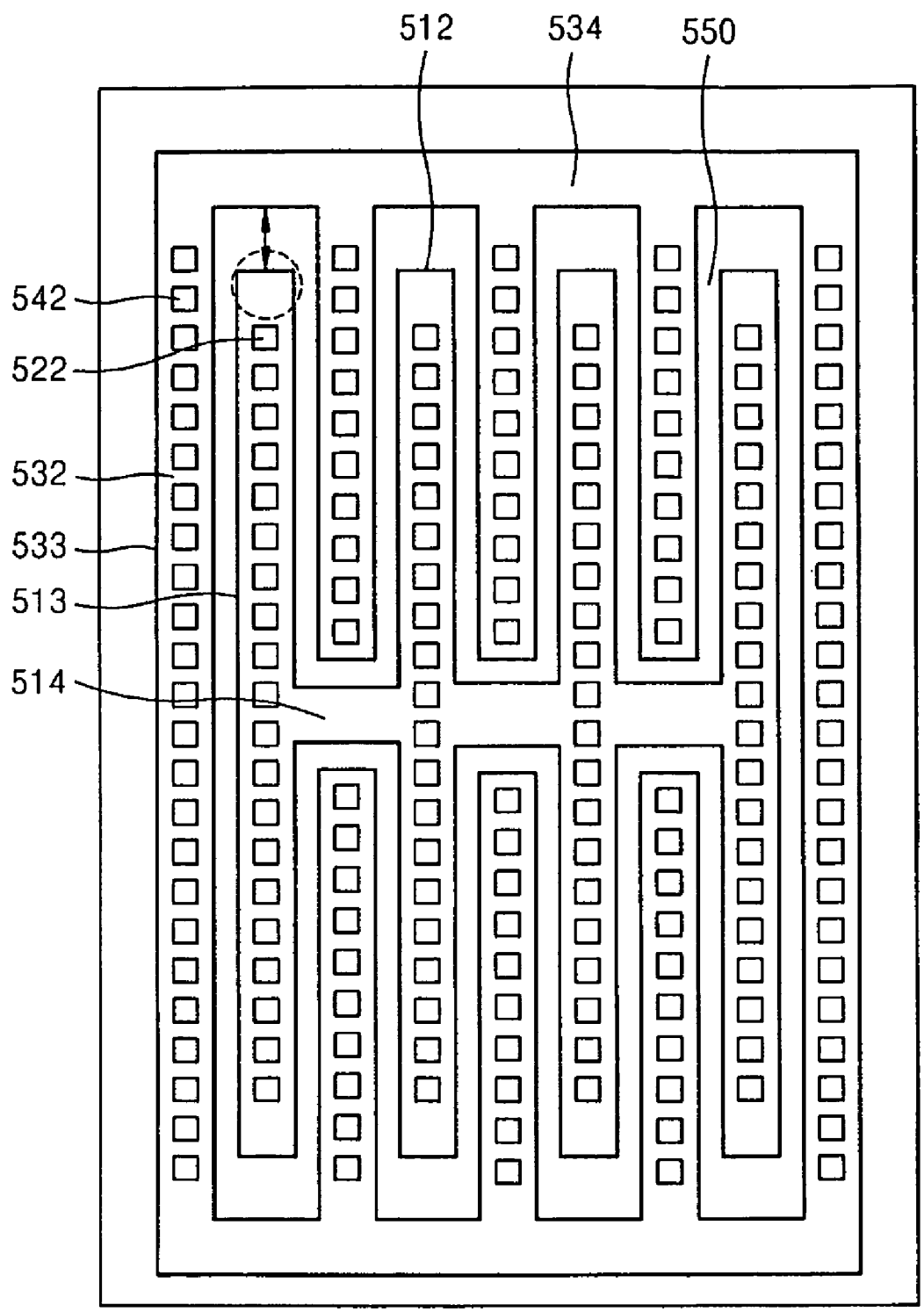
FIG. 6 illustrates a layout of an embodiment of an ESD protection diode according to another aspect of the present invention.

FIG. 6 illustrates a layout of an embodiment of an ESD protection diode according to another aspect of the present invention. Active regions 512 of FIG. 6 also include active lines 513 and an active connection portion 514 connecting middle portions of the active lines 513. Also, sub-regions 532 of FIG. 6 include sub-lines 533 that are alternately arranged with the active lines 513 of the active regions and a sub-connecting portion 534 connecting ends of the sub-lines 533. In the ESD protection diode of FIG. 6, a distance between the end of the active lines 513 and the sub-connection portion 534 of the sub-region (the distance illustrated by an arrow) is greater than a distance between the active lines 513 and the sub-lines 533, and at the same time, no active contact is formed at an end of the active lines 513 (indicated by a dashed circle). Accordingly, the effects of the embodiments of FIGS. 4 and 5 can be obtained at the same time. That is, by leaving a space between the end of the active lines 513 and the sub-connection portion 534, a resistance seen from the end of the active lines 513 is increased as much as a resistance seen from the middle portions of the active lines 513. Also, by removing contacts of the ends of the active lines 513, concentration of ESD current on the active contacts 522 at the ends of the active regions 512 can be prevented.

In the above-described embodiments of the present invention, ESD protection diodes having N-type wells, P-type active regions, and N-type sub-regions are described. However, the embodiments of the present invention may also be applied in the same manner to ESD protection diodes having P-type wells, N-type active regions, and P-type sub-regions.

According to the present invention, as the active regions and the sub-regions of the ESD protection diode are arranged in alternating parallel lines, the resistance at each position of the active regions is uniform, except at the ends thereof. As the resistance is uniform, ESD current can be uniformly distributed over the entire ESD protection diode, thereby improving the performance of the ESD protection diode. Also, the reliability of the ESD protection diode can be increased because current does not concentrate at the ends of the active regions.

While aspects of the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electrostatic discharge (ESD) protection diode comprising:
   a well formed in a semiconductor substrate of a first conductivity type;
   an active region formed of a second conductivity type in the well and including a plurality of first active lines extending in a first direction;
   second active lines extending in a second direction and connecting the first active lines;
   a sub-region formed of the first conductivity type and including a plurality of first sub-lines extending in the first direction, the first sub-lines being formed in the well, arranged to surround an outer region of the first active lines, and in an alternating arrangement with the first active lines;
   second sub-lines extending in the second direction and connecting ends of the first sub-lines extending in the first direction;
   a device isolation region separating the active regions and the sub-regions;
   a plurality of active contacts arranged in a row in the active regions; and
   a plurality of sub-contacts arranged in a row in the sub-region
   wherein a distance between the first active lines and the second sub-lines is greater than a distance between the first active lines and the first sub-lines.

2. The ESD protection diode of claim 1, wherein the second active lines are void of active contacts.

3. The ESD protection diode of claim 1, wherein the second direction sub-lines are void of sub-contacts.

4. The ESD protection diode of claim 1, wherein end portions of each first active lines are void of active contacts.

5. The EDS protection diode of claim 1, wherein a distance between the first active lines and the second sub-lines is greater than a distance between the first active lines and the first sub-lines, and end portions of each of the first active lines are void of active contacts.

6. The EDS protection diode of claim 1, wherein the first conductivity is a p-type, and the second conductivity is an n-type.

7. The ESD protection diode of claim 1, wherein the first conductivity is an n-type, and the second conductivity is a p-type.

8. The ESD protection diode of claim 1, wherein the active region is heavily doped.

9. The ESD protection diode of claim 1, wherein the sub-region is heavily doped.

10. The ESD protection diode of claim 1, wherein the active contacts are arranged at regular intervals.

11. The ESD protection diode of claim 1, wherein the sub-contacts are arranged at regular intervals.

12. The ESD protection diode of claim 1, wherein the second direction is substantially perpendicular to the first direction.

13. An electrostatic discharge (ESD) protection diode comprising:
- a well formed in a semiconductor substrate of a first conductivity type;
- an active region formed of a second conductivity type in the well and including a plurality of first active lines extending in a first direction;
- second active lines extending in a second direction and connecting the first active lines;
- a sub-region formed of the first conductivity type and including a plurality of first sub-lines extending in the first direction, the first sub-lines being formed in the well, arranged to surround an outer region of the first active lines, and in an alternating arrangement with the first active lines;
- second sub-lines extending in the second direction and connecting ends of the first sub-lines extending in the first direction;
- a device isolation region separating the active regions and the sub-regions;
- a plurality of active contacts arranged in a row in the active regions; and
- a plurality of sub-contacts arranged in a row in the sub-region,
- wherein a distance between the first active lines and the second sub-lines is greater than a distance between the first active lines and the first sub-lines, and end portions of each of the first active lines are void of active contacts.

* * * * *